(12) United States Patent
Fukuda

(10) Patent No.: US 8,143,730 B2
(45) Date of Patent: Mar. 27, 2012

(54) SEMICONDUCTOR DEVICE AND METHOD OF MANUFACTURING THE SAME

(75) Inventor: Hirofumi Fukuda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 112 days.

(21) Appl. No.: 12/659,762

(22) Filed: Mar. 19, 2010

(65) Prior Publication Data
US 2010/0244285 A1    Sep. 30, 2010

(30) Foreign Application Priority Data

Mar. 27, 2009 (JP) ................................ 2009-078122

(51) Int. Cl.
*H01L 23/29* (2006.01)
(52) U.S. Cl. ........ 257/790; 257/618; 257/620; 257/623; 257/E23.503; 257/E21.504; 438/110; 438/126
(58) Field of Classification Search .................. 257/788, 257/E23.116, E21.503, E21.504, 502, 527, 257/594, 618–628, 790; 438/126, 66–68, 438/110, 114
See application file for complete search history.

(56) References Cited

U.S. PATENT DOCUMENTS

| | | | |
|---|---|---|---|
| 6,417,026 B2 * | 7/2002 | Gotoh et al. .................. | 438/108 |
| 6,613,608 B1 * | 9/2003 | Yamaguchi et al. .......... | 438/119 |
| 7,382,060 B2 * | 6/2008 | Farnworth et al. ............ | 257/792 |
| 2008/0023802 A1 | 1/2008 | Suzuki | |

FOREIGN PATENT DOCUMENTS

| | | |
|---|---|---|
| JP | 8-293476 | 11/1996 |
| JP | 2008-28243 | 2/2008 |

* cited by examiner

*Primary Examiner* — Jasmine Clark
(74) *Attorney, Agent, or Firm* — McGinn IP Law Group, PLLC

(57) ABSTRACT

In a semiconductor device, corner portions of a inner insulating film are chamfered, and hence a damage is less likely to reach the corner portion of the inner insulating film, though the corner portion of an outer insulating film is damaged. Therefore, a hermeticity of a semiconductor element can be effectively maintained, and the yield of semiconductor pellets can be improved. Moreover, since it is not necessary to chamfer the corner portion of the outer insulating film, the structure remains simple and the productivity can be improved.

7 Claims, 5 Drawing Sheets

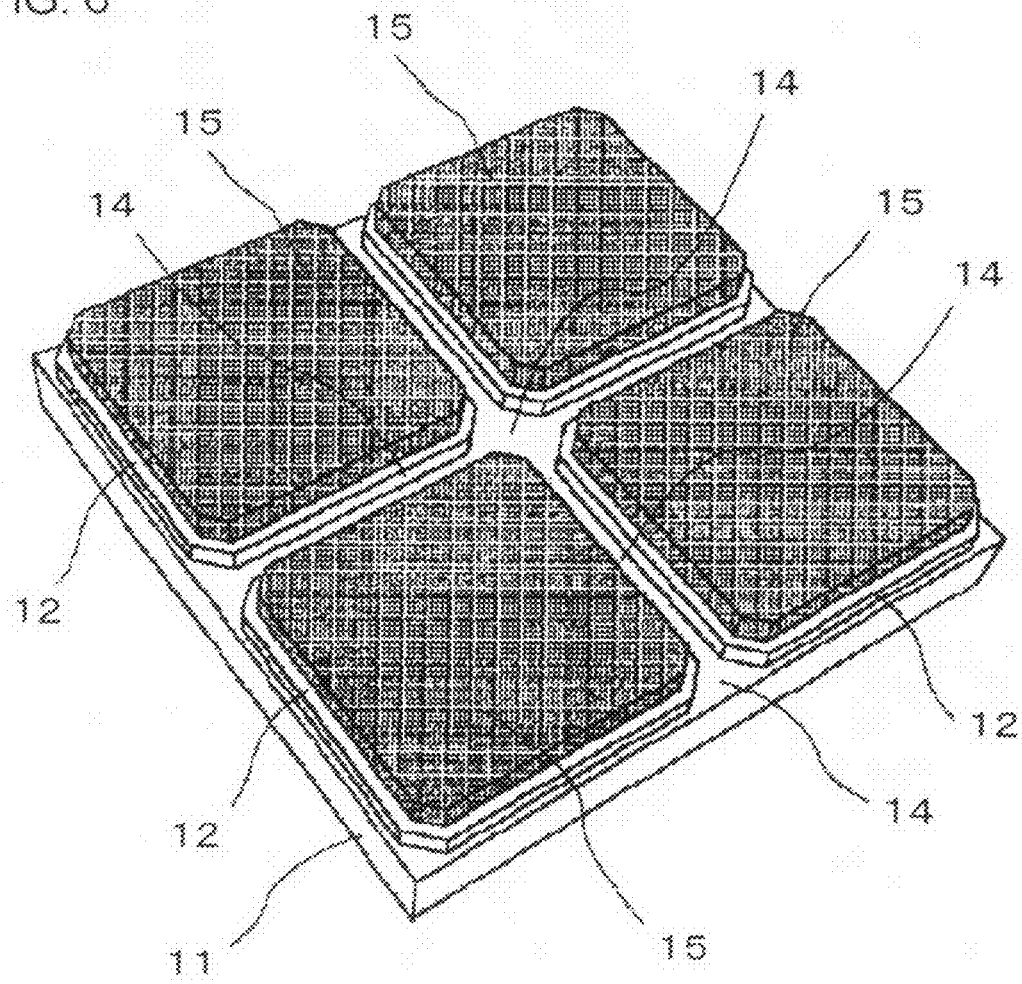

SEMICONDUCTOR DEVICE AND METHOD OF MANUFACTURING THE SAME

This application is based on Japanese patent application No. 2009-078122, the content of which is incorporated hereinto by reference.

BACKGROUND

1. Technical Field

The present invention relates to a semiconductor device that includes a plurality of semiconductor pellets disposed in a row on a wafer substrate, with a scribe region disposed therebetween, and more particularly to a semiconductor device in which semiconductor element formed on a surface of the wafer substrate is hermetically enclosed in duplicate by a first and a second insulating film, and to a method of manufacturing such semiconductor device.

2. Related Art

In the semiconductor pellet, which is a semiconductor device, normally the element and electrode are covered with an insulating film to thereby protect the chip surface. To split (pelletize) the wafer into individual chips, methods such as a blade dicing and scribe breaking are employed.

During such process, the pellet suffers chipping and flaw in the vicinity of an outer peripheral edge. Here, a majority of the chipping defect takes place on a corner portion of the pellet. In the case where such chipping and flaw reaches an inner portion beyond the insulating film, moisture intrudes into the chip through the crack of the insulating film, thereby degrading moisture resistance. Moreover, in the case where such chipping and flaw reaches inside of the chip, the element or electrode may be broken, which results in loss of the essential function of the element.

It is to be noted that although the plurality of semiconductor pellets, not pelletized yet and aligned on the semiconductor substrate with the scribe region disposed therebetween, is herein referred to as the semiconductor device, the pelletized semiconductor pellets are also semiconductor devices.

Referring to FIG. 5, a first related art will be described below. A semiconductor device of the first related art includes an anti-chipping wall 3 provided along the outer periphery of semiconductor pellets 2 formed on a wafer substrate 1.

When the semiconductor pellets 2 on the wafer substrate 1 thus made up are pelletized along a scribe region 4, the anti-chipping wall 3 serves to block the progress of the chipping and flaw, to thereby protect the semiconductor pellet 2, in other words the semiconductor device (For example, refer to Japanese Laid-open patent publication No. 2008-028243).

Referring then to FIG. 6, a second related art will be described below. A semiconductor device of the second related art includes an insulating film 15 covering an inner region of a semiconductor pellet 12, which is a semiconductor device, formed on a wafer substrate 11, and corner portions of the semiconductor pellet 12 and the insulating film 15 are chamfered.

When the semiconductor pellets 12 on the wafer substrate 11 thus made up are pelletized along the scribe region 14, the corner portions of the semiconductor pellet 12 and the insulating film 15 are less likely to suffer the chipping, and therefore the semiconductor pellet 12 can be protected (For example, refer to Japanese Published patent application A-H08-293476).

In the case of the first related art, it is necessary to expand the scribe region 4 because of the presence of the anti-chipping wall 3 along the outer periphery of the semiconductor pellet 2. This results in a decrease in number of pellets that can be mounted on each wafer substrate 1.

Besides, an additional diffusion process (photo resist coat→exposure→development→film formation→photo resist removal) is required to form the anti-chipping wall 3, which leads to an increase in manufacturing cost of the wafer (material cost and wage) and to an extended production lead time.

In the case of the second related art, since a region of the semiconductor pellet 12 is exposed along the periphery of the insulating film 15, it is necessary to expand the scribe region in order to prevent the chipping on the semiconductor pellet 12.

This leads to a decrease in number of pellets per wafer substrate, as with the first related art. Besides, since the corner portions of both the semiconductor pellet 12 and the insulating film 15 are chamfered in the second example, the process of chamfering degrades the productivity.

SUMMARY

In one embodiment, there is provided a semiconductor device which includes:

a wafer substrate; a plurality of semiconductor elements disposed in a row on the wafer substrate;

a first insulating film provided on the wafer substrate so as to hermetically enclose each of the semiconductor element; and a second insulating film provided on the wafer substrate so as to hermetically enclose the first insulating film;

wherein the first insulating film is of a polygonal plan-view shape with each corner chamfered.

In the semiconductor device thus constructed, the semiconductor elements on the surface of the wafer substrate are hermetically enclosed in duplicate by the first insulating film and the second insulating film. The first insulating film is provided in each region where the pellet is located, with the scribe region disposed therebetween, and the semiconductor elements are pelletized along the scribe region. In the case where the corner portion of the second insulating film is damaged in the pelletizing process to such an extent that the damage reaches the corner portion of the first insulating film, the hermeticity of the semiconductor element is degraded, which results in lowered yield. However, since the corner portion of the first insulating film is chamfered, probability that the damage reaches the corner portion of the first insulating film is minimized, even though the corner portion of the second insulating film is damaged.

In the foregoing semiconductor device, the second insulating film may be of a polygonal plan-view shape with each corner chamfered.

The foregoing semiconductor device may further comprise a bonding pad provided inside of the corner portion of the first insulating film, and the bonding pad may be of a polygonal plan-view shape that includes a chamfered portion formed at a position corresponding to the chamfered portion of the first insulating film.

In the foregoing semiconductor device, the first insulating film may be of a rectangular plan-view shape with each corner portion chamfered.

In the foregoing semiconductor device, the first insulating film may be constituted of a hydrophilic material, and the second insulating film may be constituted of a hydrophobic material.

In the foregoing semiconductor device, the first insulating film may be constituted of an oxide layer, and the second insulating film may be constituted of a nitride film.

In another embodiment, there is provided a method of manufacturing a semiconductor device which includes:

forming a plurality of semiconductor elements in a row on a surface of a wafer substrate, each on a region to be formed into a pellet;

forming a first insulating film in a polygonal plan-view shape with each corner portion chamfered, on the surface of the wafer substrate so as to hermetically enclose the semiconductor element; and forming a second insulating film in a row, with the scribe region disposed between the second insulating films on the surface of the wafer substrate so as to hermetically enclose the first insulating film.

It is to be noted that the constituents of the present invention do not necessarily have to be individually independent, but may be configured such that a plurality of constituents constitutes a single member; that a constituent is composed of a plurality of members; that a constituent is a part of another constituent; that a part of a constituent and a part of another constituent overlap; and so forth.

With the semiconductor device according to the present invention, since the corner portion of the first insulating film is chamfered, probability that the damage reaches the corner portion of the first insulating film is minimized, even though the corner portion of the second insulating film is damaged in the pelletizing process or the like. Such structure enables effectively maintaining the hermeticity of the semiconductor elements, thereby improving the yield of the semiconductor pellets, which are also semiconductor devices. Moreover, since it is not necessary to chamfer the corner portion of the second insulating film, the structure remains sufficiently simple and therefore the productivity can be maintained.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 is a perspective view showing a second related art of a semiconductor device.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
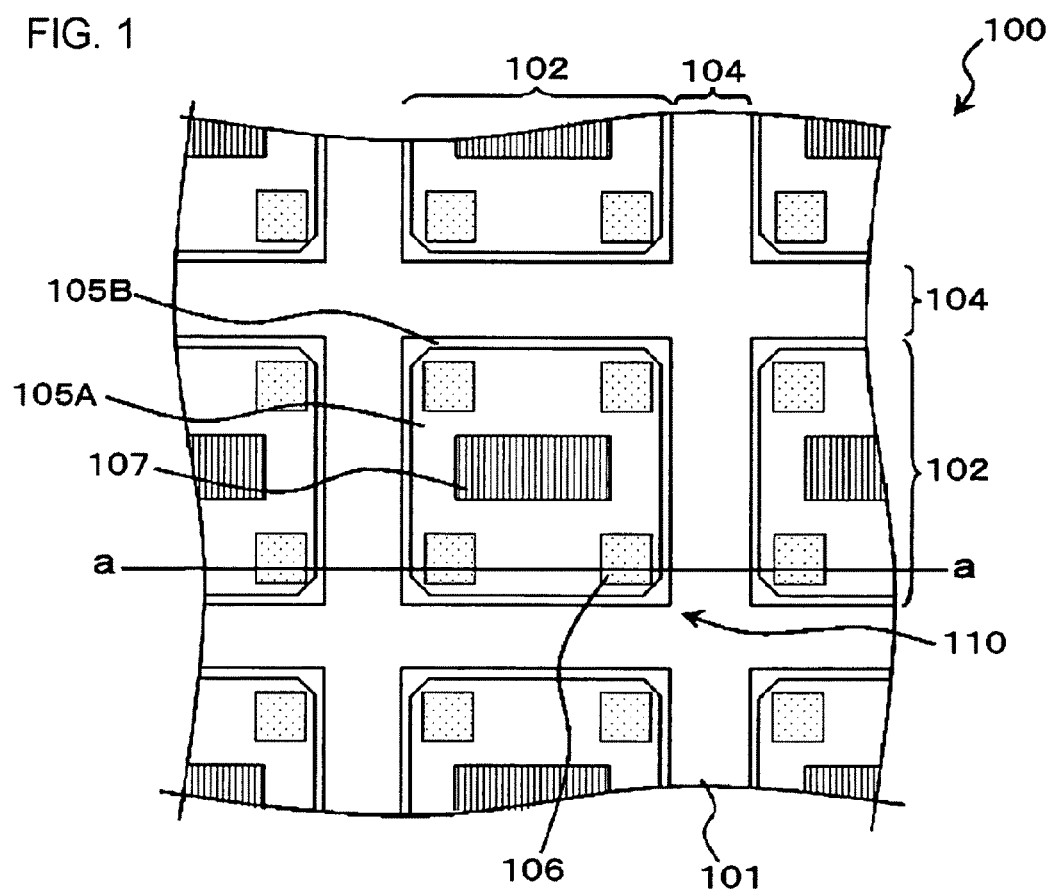
FIG. 1 is a fragmentary plan view showing a semiconductor device according to an embodiment of the present invention.
Figure 2:
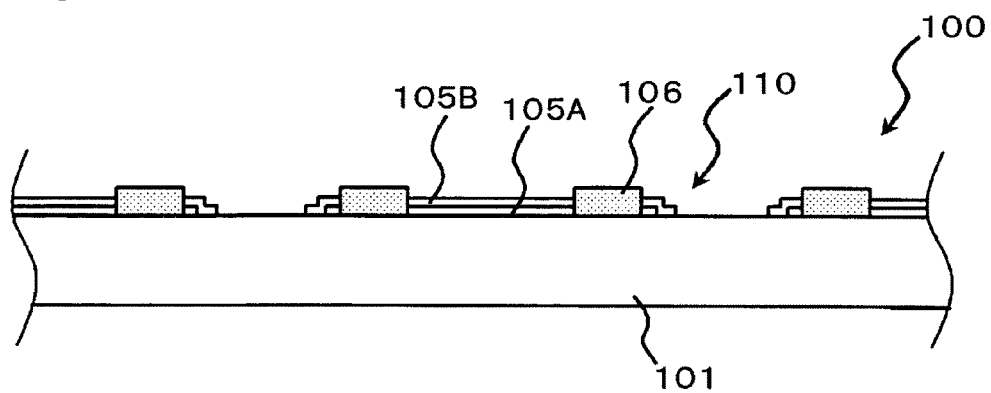
FIG. 2 is a cross-sectional view taken along a line a-a in FIG. 1.

Hereunder, an embodiment of the present invention will be described in details, referring to FIGS. 1 and 2. In this embodiment, a back and forth, left and right, and upper and lower direction are specified based on the drawings. Such directions are, however, referred to only for the sake of explicitness in explaining the positional relationship between the constituents, and not intended for limiting the directions in the manufacturing process or in use of the products embodying the present invention.

A semiconductor device 100 according to this embodiment includes a plurality of semiconductor pellets 110, each of which is a semiconductor device as stated above, aligned in a row on a wafer substrate 101 with a scribe region 104 provided between the semiconductor pellets 110.

The semiconductor device 100 according to this embodiment includes the wafer substrate 101, the semiconductor elements 107 disposed in a row on the wafer substrate 101, a first insulating film 105A provided on the wafer substrate 101 so as to hermetically enclose the semiconductor element 107, and a second insulating film 105B provided on the wafer substrate 101 so as to hermetically enclose the first insulating film 105A, and the first insulating film 105A is of a polygonal plan-view shape with each corner chamfered.

To be more detailed, the first insulating film 105A is of a rectangular plan-view shape with the four corner portions chamfered. The second insulating film 105B is of a rectangular plan-view shape having four corner portions.

Also, the first insulating film 105A is constituted of an oxide layer, which is hydrophilic. The second insulating film 105B is constituted of a nitride film, which is hydrophobic. Further, on the inner side of the four corner portions of the first insulating film 105A, a bonding pad 106 is provided, which is also of a rectangular plan-view shape.

Here, a method of manufacturing the semiconductor device 100 according to this embodiment will be briefly described. First, the semiconductor elements 107 are formed in a row, on each of a plurality of regions to be pelletized 102 on the surface of the wafer substrate 101.

Then the first insulating film 105A, which serves to hermetically enclose the semiconductor element 107, is formed on the surface of the wafer substrate 101, in a polygonal plan-view shape with each corner portion chamfered. The second insulating film 105B is then formed in a row, with the scribe region 104 disposed therebetween on the surface of the wafer substrate 101, so as to hermetically enclose the first insulating film 105A.

Upon pelletizing the semiconductor device 100 thus formed along the scribe region 104, the semiconductor pellets 110, each including the semiconductor element 107 formed on the surface of the wafer substrate 101 and hermetically enclosed in duplicate by the first and the second insulating films 105A, 105B, are mass-produced as semiconductor devices.

The semiconductor device 100 according to this embodiment formed as above on the wafer substrate 101 leads, upon being pelletized along the scribe region 104, to the mass production in such a structure that the semiconductor element 107 formed on the surface of the wafer substrate 101 is hermetically enclosed in duplicate by the first and the second insulating films 105A, 105B.

In the semiconductor device 100 configured as above according to this embodiment, the semiconductor elements 107 on the surface of the wafer substrate 101 are hermetically enclosed in duplicate by the first insulating film 105A and the second insulating film 105B.

The first insulating film 105A is provided on each region to be formed into a pellet 102 along the scribe region 104, disposed between the regions to be pelletized 102, and the semiconductor device 100 is pelletized into the semiconductor pellets 110, which are also semiconductor devices, along the scribe region 104.

In the case where the corner portion of the second insulating film 105B is damaged in the pelletizing process to such an extent that the damage reaches the corner portion of the first insulating film 105A, the hermeticity of the semiconductor element 107 is degraded, which results in lowered yield. Moreover, since the first insulating film 105A constituted of the oxide layer is hydrophilic, the moisture resistance of the semiconductor element 107 is significantly degraded if the damage of the second insulating film 105B progresses farther.

In the semiconductor device 100 according to this embodiment, however, since the corner portion of the first insulating film 105A is chamfered, probability that the damage reaches the corner portion of the first insulating film 105A is minimized, even though the corner portion of the second insulating film 105B is damaged.

Therefore, the semiconductor device 100 according to this embodiment enables effectively maintaining the hermeticity of the semiconductor elements 107, thereby improving the yield of the semiconductor pellets 110 which are semiconductor devices, even though the corner portion of the second insulating film 105B is damaged in the pelletizing process or the like.

Further, since it is not necessary to chamfer the corner portion of the second insulating film 105B, the structure remains sufficiently simple and therefore the productivity can be maintained. Moreover, since there is no need to provide the anti-chipping wall 3 as in the conventional example, the number of pellets per wafer substrate 101 can be increased. In addition, the diffusion process for forming the anti-chipping wall 3 can be skipped, and consequently the wafer manufacturing cost can be suppressed and the production lead time can be shortened.

It is to be understood that the present invention is not limited to this embodiment, but may be modified within the scope and spirit of the present invention. To cite a few examples, according to the foregoing embodiment only the first insulating film 105A is of a rectangular shape with the corner portions chamfered, and the second insulating film 105B is of a rectangular shape with the corner portions unchamfered.

Figure 3:
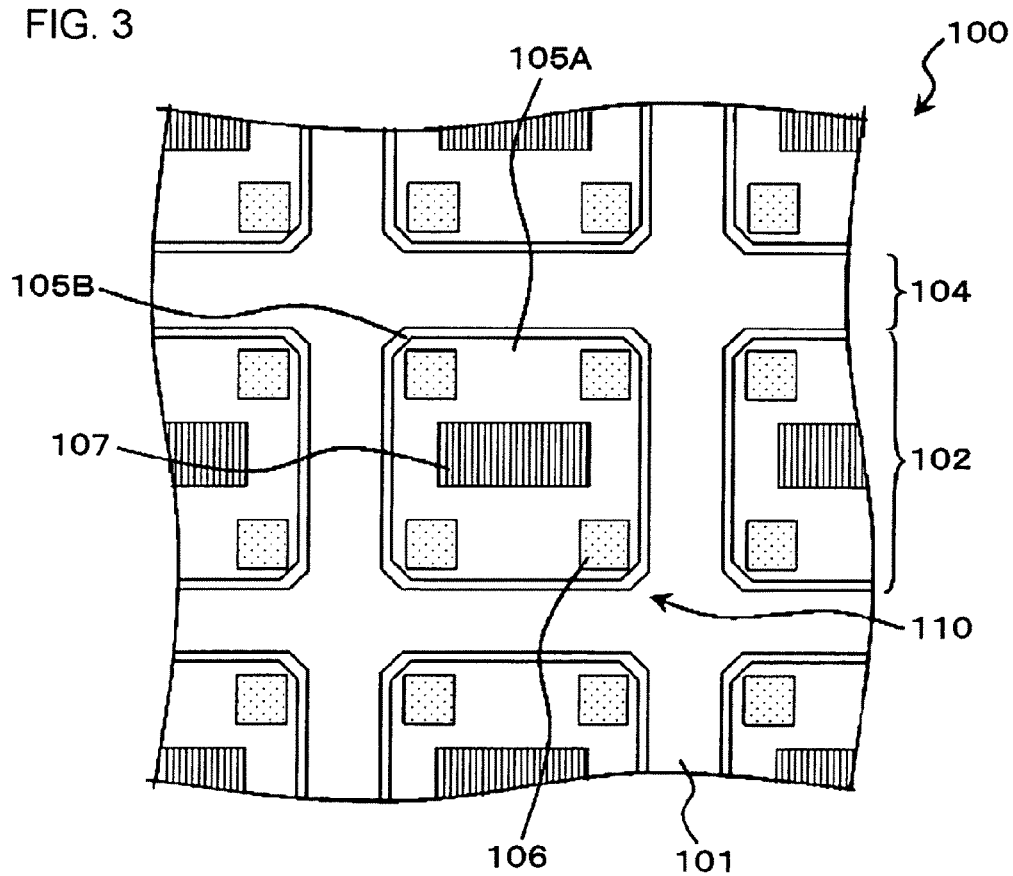
FIG. 3 is a fragmentary plan view showing a variation of the semiconductor device.

However, FIG. 3 second insulating film 105B may also be formed in a rectangular plan-view shape (an example of a polygonal shape) with the corner portions chamfered. In this case, the corner portion of the second insulating film 105B also becomes less likely to be damaged in the pelletizing process, and therefore the yield of the semiconductor element 107 can be further upgraded.

Figure 4:
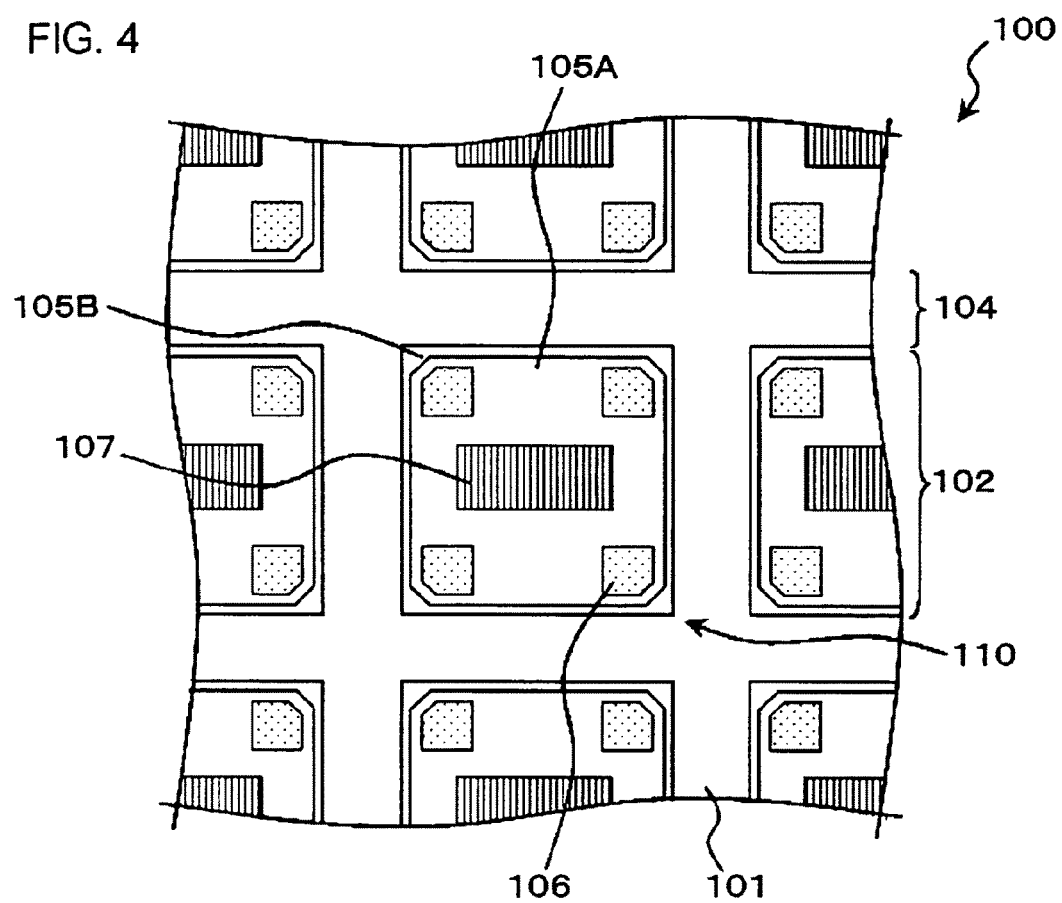
FIG. 4 is a fragmentary plan view showing another variation of the semiconductor device.
Figure 5:
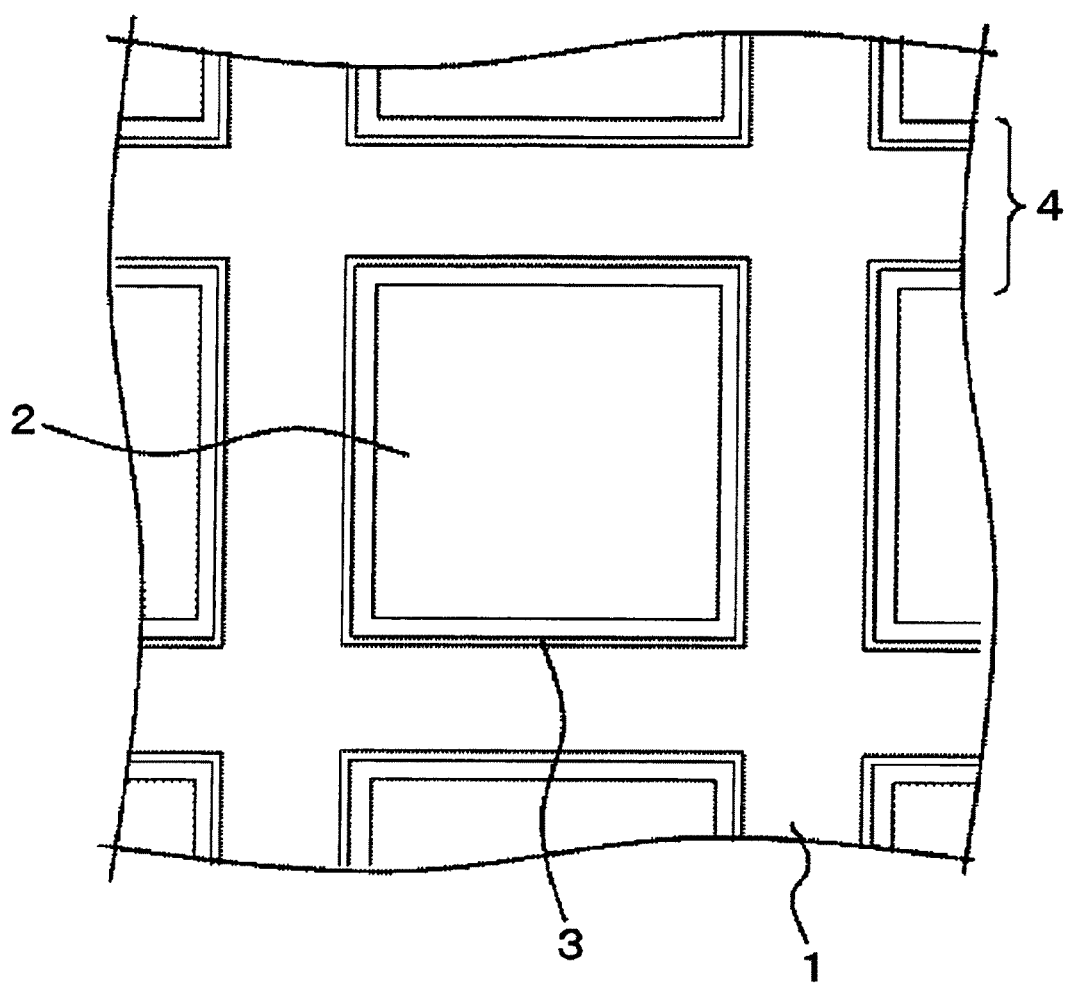
FIG. 5 is a fragmentary plan view showing a first related art of a semiconductor device.

Also, the bonding pad 106 of a rectangular shape is provided on the inner side of the chamfered corner portion of the first insulating film 105A, in the foregoing embodiment. Here, as shown in FIG. 4, the bonding pad 106 may be of a polygonal plan-view shape that includes a chamfered portion formed at a position corresponding to the chamfered portion of the first insulating film 105A.

Such configuration allows locating the bonding pad 106 closer to the chamfered corner portion of the first insulating film 105A, which leads to a higher level of integration of the semiconductor pellet 110.

Naturally, the foregoing embodiment and the plurality of variations may be combined unless contradiction is generated. Also, whereas the structure of each part of the embodiment and the variations thereof has been specifically described, such structure may be modified in various manners within the scope of the present invention.

It is apparent that the present invention is not limited to the above embodiment, but may be modified and changed without departing from the scope and spirit of the invention.

What is claimed is:

1. A semiconductor device, comprising:
   a wafer substrate;
   a plurality of semiconductor elements disposed in a row on the wafer substrate;
   a first insulating film provided on the wafer substrate so as to hermetically enclose each of the semiconductor element; and
   a second insulating film provided on the wafer substrate so as to hermetically enclose the first insulating film;
   wherein the first insulating film is of a polygonal plan-view shape with each corner chamfered.

2. The semiconductor device according to claim 1,
   wherein the second insulating film is of a polygonal plan-view shape with each corner chamfered.

3. The semiconductor device according to claim 1,
   further comprising a bonding pad provided inside of the corner portion of the first insulating film;
   wherein the bonding pad is of a polygonal plan-view shape that includes a chamfered portion formed at a position corresponding to the chamfered portion of the first insulating film.

4. The semiconductor device according to claim 1,
   wherein the first insulating film is of a rectangular plan-view shape with each corner portion chamfered.

5. The semiconductor device according to claim 1,
   wherein the first insulating film is constituted of a hydrophilic material; and
   the second insulating film is constituted of a hydrophobic material.

6. The semiconductor device according to claim 1,
   wherein the first insulating film is constituted of an oxide film; and
   the second insulating film is constituted of a nitride film.

7. A method of manufacturing a semiconductor device, comprising:
   forming a plurality of semiconductor elements in a row on a surface of a wafer substrate, each on a region to be formed into a pellet;
   forming a first insulating film in a polygonal plan-view shape with each corner portion chamfered, on the surface of the wafer substrate so as to hermetically enclose the semiconductor element; and
   forming a second insulating film in a row, with the scribe region disposed between the second insulating films on the surface of the wafer substrate so as to hermetically enclose the first insulating film.

* * * * *